United States Patent
Brianese (10) Patent No.: US 10,477,724 B2
(45) Date of Patent: Nov. 12, 2019

(54) EFFICIENT HEAT EXCHANGE SYSTEMS AND METHODS

(71) Applicant: Datalogic IP Tech, S.r.l., Bologna (IT)

(72) Inventor: Bruno Pietro Brianese, Samone Canavese (IT)

(73) Assignee: Datalogic IP Tech, S.r.l., Bologna (IT)

( * ) Notice: Subject to any disclaimer, the term of this patent is extended or adjusted under 35 U.S.C. 154(b) by 935 days.

(21) Appl. No.: 14/642,313

(22) Filed: Mar. 9, 2015

(65) Prior Publication Data

US 2016/0270254 A1 Sep. 15, 2016

(51) Int. Cl.
*F28F 7/00* (2006.01)
*H05K 7/20* (2006.01)

(52) U.S. Cl.
CPC .................. *H05K 7/20154* (2013.01)

(58) Field of Classification Search
CPC ............ H05K 7/20154; H05K 7/202
USPC .................................................. 165/80.2
See application file for complete search history.

(56) References Cited

U.S. PATENT DOCUMENTS

| | | | | | |
|---|---|---|---|---|---|
| 4,585,122 | A * | 4/1986 | Stegenga | ............. | H05K 7/1427 220/260 |
| 5,773,755 | A * | 6/1998 | Iwatare | ................... | H05K 7/202 174/17 VA |
| 5,869,919 | A * | 2/1999 | Sato | ...................... | H01J 29/006 313/17 |
| 6,081,425 | A * | 6/2000 | Cheng | ..................... | G06F 1/203 165/122 |
| 6,101,090 | A * | 8/2000 | Gates | .................. | H05K 7/20136 165/104.33 |
| 6,348,653 | B1 * | 2/2002 | Cho | ...................... | H05K 9/0041 174/383 |
| 6,501,662 | B2 * | 12/2002 | Ikeda | ..................... | H02M 7/003 174/252 |
| 6,621,702 | B2 * | 9/2003 | Elias | .................... | H01L 23/3733 165/104.33 |
| 6,888,722 | B2 * | 5/2005 | Viswanath | .......... | H01L 23/4275 165/185 |
| 6,972,957 | B2 * | 12/2005 | Beihoff | ................. | B60L 15/007 361/698 |
| 7,061,775 | B2 * | 6/2006 | Beihoff | ................. | B60L 15/007 361/818 |

(Continued)

FOREIGN PATENT DOCUMENTS

| | | |
|---|---|---|
| DE | 28 44 672 A1 | 4/1980 |
| EP | 0 944 297 A2 | 9/1999 |
| EP | 0 946 085 A1 | 9/1999 |

OTHER PUBLICATIONS

International Search Report, dated Jun. 2, 2016, for International Application No. PCT/US2016/021001, 6 pages.

(Continued)

*Primary Examiner* — Claire E Rojohn, III
(74) *Attorney, Agent, or Firm* — Cozen O'Connor (57) ABSTRACT

A heat exchange system can include an inner enclosure, an outer enclosure, a flow path between the inner and the outer enclosure, an outer fan to induce air flow through the flow path, an inner fan to circulate air within the inner enclosure, and a heat source within the inner enclosure. The heat exchange systems can be used to dissipate heat from the electrical components of various devices, such as laser marking systems, machine readable symbol readers, and dimensioning systems.

16 Claims, 6 Drawing Sheets

(56) References Cited

U.S. PATENT DOCUMENTS

| | | | | |
|---|---|---|---|---|
| 7,069,975 B1* | 7/2006 | Haws | B64G 1/50 | 165/10 |
| 7,095,612 B2 | 8/2006 | Beihoff | B60L 15/007 | 361/696 |
| 7,142,434 B2* | 11/2006 | Beihoff | H02M 1/44 | 361/818 |
| 7,177,153 B2* | 2/2007 | Radosevich | B60L 15/007 | 361/699 |
| 7,187,568 B2* | 3/2007 | Radosevich | H02M 1/44 | 361/699 |
| 7,209,351 B2* | 4/2007 | Wei | H05K 7/20745 | 361/695 |
| 7,289,320 B2* | 10/2007 | Chang | H05K 7/20145 | 165/122 |
| 7,436,661 B2* | 10/2008 | Fong | H02M 7/003 | 323/211 |
| 7,515,423 B2* | 4/2009 | Peng | H05K 7/20936 | 165/104.21 |
| 7,529,087 B2* | 5/2009 | Dubrule | G06F 1/20 | 361/679.5 |
| 7,535,707 B2* | 5/2009 | Seibold | G06F 1/188 | 361/679.49 |
| 7,679,906 B2* | 3/2010 | Fong | H05K 7/20909 | 174/547 |
| 7,733,647 B2* | 6/2010 | Lee | H05K 5/0213 | 361/690 |
| 7,813,128 B2* | 10/2010 | Marchand | H05K 7/20909 | 361/694 |
| 7,843,684 B2* | 11/2010 | Lu | H05K 7/20909 | 165/104.33 |
| 7,929,301 B2* | 4/2011 | Fong | H05K 7/20909 | 165/104.33 |
| 8,102,670 B2* | 1/2012 | Sakamoto | H05K 1/144 | 361/792 |
| 8,107,255 B2* | 1/2012 | Sakamoto | H05K 1/144 | 361/695 |
| 8,169,784 B2* | 5/2012 | Sakamoto | H01L 25/162 | 361/729 |
| 8,233,040 B2* | 7/2012 | Patel | G06K 7/10 | 348/61 |
| 8,339,784 B2* | 12/2012 | Pirillis | H01R 13/6586 | 361/679.5 |
| 8,369,067 B2* | 2/2013 | Nakamura | H01M 10/46 | 361/626 |
| 8,477,494 B2* | 7/2013 | Pruszenski | H05K 7/20127 | 361/679.46 |
| 8,493,732 B2* | 7/2013 | Lineal | A47B 23/04 | 361/679.48 |
| 9,192,079 B2* | 11/2015 | Loth | H05K 7/20918 | |
| 9,258,926 B2* | 2/2016 | Smith | H05K 7/20818 | |
| 9,408,332 B2* | 8/2016 | Smith | H05K 7/20836 | |
| 9,426,932 B2* | 8/2016 | Kinstle | H05K 7/20809 | |
| 9,560,789 B2* | 1/2017 | Smith | H05K 5/0017 | |
| 9,861,015 B2* | 1/2018 | Sagneri | H05K 7/209 | |
| 2004/0007348 A1* | 1/2004 | Stoller | H02B 1/565 | 165/47 |
| 2005/0248923 A1* | 11/2005 | Hsu | H05K 7/20445 | 361/704 |
| 2007/0247817 A1* | 10/2007 | Huang | H02M 7/003 | 361/719 |
| 2008/0198557 A1* | 8/2008 | Lim | H01L 23/3675 | 361/719 |
| 2008/0278912 A1* | 11/2008 | Zavadsky | H04Q 1/02 | 361/697 |
| 2008/0304238 A1* | 12/2008 | Chien | H05K 7/20427 | 361/705 |
| 2009/0284923 A1* | 11/2009 | Rytka | H05K 7/20927 | 361/700 |
| 2010/0254092 A1* | 10/2010 | Dong | B29C 45/0005 | 361/705 |
| 2010/0271775 A1* | 10/2010 | Bult | F15D 1/08 | 361/689 |
| 2011/0159864 A1* | 6/2011 | Park | H03K 17/96 | 455/418 |
| 2011/0278923 A1* | 11/2011 | Pance | H01R 13/7039 | 307/31 |
| 2012/0069606 A1* | 3/2012 | Sagneri | H02M 3/158 | 363/21.02 |
| 2012/0074840 A1* | 3/2012 | Chang | H02J 9/06 | 315/76 |
| 2012/0206880 A1* | 8/2012 | Andres | H01L 23/4275 | 361/700 |
| 2012/0235631 A1* | 9/2012 | Nakashima | H01M 14/005 | 320/107 |
| 2012/0298341 A1* | 11/2012 | Fernandez | H04Q 1/025 | 165/121 |
| 2014/0268563 A1* | 9/2014 | Sagneri | H05K 7/20909 | 361/692 |
| 2016/0212841 A1* | 7/2016 | Hartmann | H05K 7/20454 | |
| 2016/0270254 A1* | 9/2016 | Brianese | H05K 7/20154 | |

OTHER PUBLICATIONS

Written Opinion of the International Searching Authority, dated Jun. 2, 2016, for International Application No. PCT/US2016/021001, 5 pages.

* cited by examiner

EFFICIENT HEAT EXCHANGE SYSTEMS AND METHODS

BACKGROUND

Technical Field

The present disclosure generally relates to heat exchange systems and methods of controlling the transfer of heat between different locations.

Description of the Related Art

Various devices and methods exist for controlling the transfer of heat through systems in desired ways. Examples of specific devices include fans, heat sinks, and heat pipes. In some cases heat exchange systems are used to cool or dissipate heat from media desired to be cooled, while in other cases, heat exchange systems are used to warm or concentrate heat in media desired to be warmed.

In electrical or electronic devices, it may be desirable to dissipate heat from various components, such as power supplies and processors. Many devices use fans to move ambient air into the device, into close proximity with the components to be cooled, and then out of the device to carry heat from the hot components out of the device. Such devices can suffer from additional problems by introducing contaminants carried by the ambient air into the device. Such contaminants can cause the build-up of dust, moisture, and other debris within the device, causing a potential multitude of problems.

Some devices use other fluids such as water as a coolant, pumping the fluid through the device to carry heat away from the hot components. Such devices can often be more expensive than is desirable, and can be larger than is desirable due to the inclusion of a fluid pumping system.

BRIEF SUMMARY

In some embodiments, a heat exchange system comprises an outer enclosure, an inner enclosure enclosed within the outer enclosure, a flow path defined between the outer enclosure and the inner enclosure, an outer fan positioned to induce air flow through the flow path, an inner fan enclosed within the inner enclosure, and a heat source enclosed within the inner enclosure.

In some cases, the heat source is an electrical component of a laser marking system. In some cases, the laser marking system is enclosed within the inner enclosure. In some cases, the heat source is an electrical component of a machine readable symbol reader. In some cases, the inner enclosure is hermetically sealed. In some cases, the heat source is positioned within an inner chamber within the inner enclosure and the inner chamber is isolated from an external environment of the system. In some cases, the inner enclosure conforms to IP Code IP52 or better. In some cases, the inner enclosure includes a plurality of walls and the heat source is separated from each of the walls. In some cases, the heat source is a first heat source and the system further comprises a second heat source in contact with at least one of the walls.

In some cases, the system includes a convective heat path from the first heat source to the plurality of walls, a conductive heat path from the second heat source to the plurality of walls, a conductive heat path through the plurality of walls, and a convective heat path from the plurality of walls out of the system through the flow path. In some cases, the system further comprises a first heat sink coupled to an interior surface of a wall of the inner enclosure and a second heat sink coupled to an exterior surface of the wall. In some cases, the second heat sink is positioned in a coldest portion of the flow path.

In some cases, the outer enclosure includes a first front wall, a rear wall opposed to the first front wall, a bottom wall, a top wall opposed to the bottom wall, a first side wall, and a second side wall opposed to the first side wall, and the inner enclosure includes a second front wall spaced apart from the first front wall, the rear wall, the bottom wall, the top wall, a third side wall spaced apart from the first side wall, and a fourth side wall spaced apart from the second side wall and opposed to the third side wall.

In other embodiments, a heat exchange system comprises an external front wall including an opening, an internal front wall spaced apart from the external front wall to form a front space between the external front wall and the internal front wall, the front space fluidically coupled to the opening, a first side wall component including a first flow channel fluidically coupled to the front space, a second side wall component including a second flow channel fluidically coupled to the front space, a rear wall including a first vent fluidically coupled to the first flow channel and a second vent fluidically coupled to the second flow channel, an outer fan positioned to induce air flow into the opening, through the front space, through the first flow channel, through the second flow channel, out of the first vent, and out of the second vent, a bottom wall and a top wall positioned such that the internal front wall, the rear wall, the first side wall component, the second side wall component, the bottom wall, and the top wall form an enclosure, an inner fan enclosed within the enclosure, and a heat source enclosed within the enclosure.

In some cases, the system further comprises a heat sink coupled to an interior surface of the internal front wall. In some cases, the inner fan is positioned closer to the internal front wall than to the rear wall. In some cases, the inner fan is positioned a distance from the internal front wall that is less than one quarter of the distance between the internal front wall and the rear wall. In some cases, the inner fan is positioned at a distance from the internal front wall that is less than a width of the internal front wall.

In still other embodiments, a method comprises generating heat at a heat source within an inner enclosure, using an inner fan within the inner enclosure to dissipate the heat from the heat source to one or more walls of the inner enclosure by convection, and using an outer fan outside the inner enclosure to induce air to flow through a flow path between the inner enclosure and an outer enclosure enclosing the inner enclosure to dissipate heat from the walls of the inner enclosure by convection.

In some cases, generating heat at a heat source comprises generating heat at an electrical component of a laser marking system. In some cases, generating heat at a heat source comprises generating heat at an electrical component of a machine readable symbol reader. In some cases, generating heat at a heat source comprises generating heat at an electrical component of a dimensioning system.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with the technology have not been shown or described in detail to avoid unnecessarily obscuring descriptions of the embodiments.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

The headings and Abstract of the Disclosure provided herein are for convenience only and do not limit the scope or meaning of the embodiments.

As used herein, the terms "front" and "rear" are used solely to distinguish one end of a system, device, or element from another, opposed end of the system, device, or element. As used herein, the terms "top" and "bottom" are used solely to distinguish one portion of a system, device, or element from another, opposed portion of the system, device, or element. As used herein, the terms "right" and "left" are used solely to distinguish one side of a system, device, or element from another, opposed side of the system, device, or element, and are generally associated with front and rear ends of the system, device, or element such that "right" and "left" have their customary meanings when viewing the system, device, or element in a direction oriented from the front to the rear end of the system, device, or element.

Figure 1:
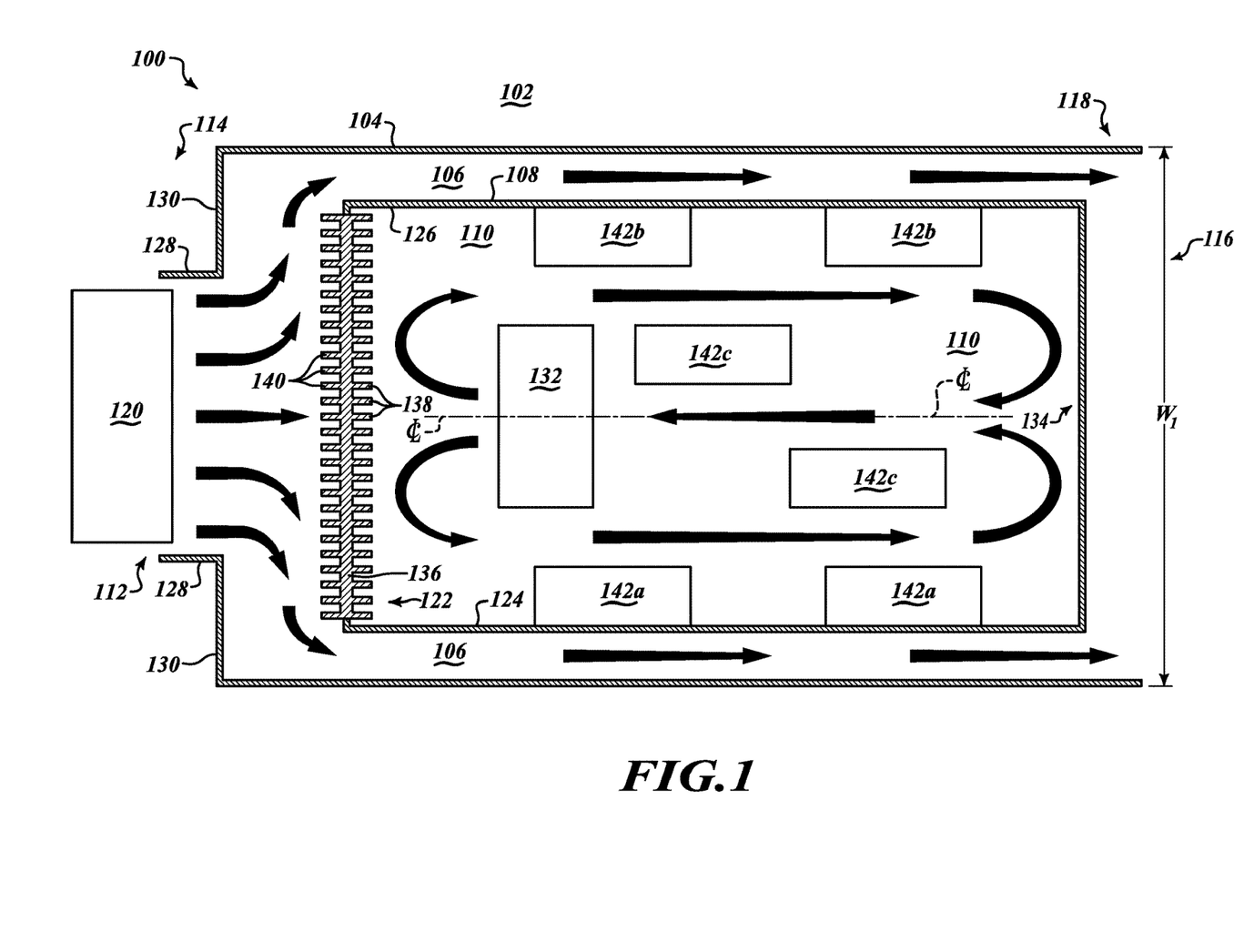
FIG. 1 is a schematic diagram of a heat exchange system, according to at least one illustrated embodiment.

FIG. 1 shows a schematic diagram of a heat exchange system 100. Heat exchange system 100 includes a first, outer enclosure 104 which separates an exterior or external environment 102 of the system 100 from an interior of the outer enclosure 104. The external environment 102 can comprise ambient air surrounding the system 100. The heat exchange system 100 also includes a second, inner enclosure 108 enclosed within the outer enclosure 104. An intermediate open space 106 is positioned inside the outer enclosure 104 and outside the inner enclosure 108, i.e., the intermediate open space 106 is positioned between and bounded or defined by the outer enclosure 104 and the inner enclosure 108. The heat exchange system 100 also includes an inner open space or chamber 110 positioned within and bounded or defined by the inner enclosure 108.

As used herein, "IP Code" refers to "Ingress Protection Code." IP Codes are specified in the International Electrotechnical Commission ("IEC") 60529 Standards document ("Standard"). The Standard provides a classification system for the degree to which an enclosure of electrical equipment prevents contaminants or foreign bodies such as tools, fingers, dust, debris, moisture, etc., from entering the enclosure. One of skill in the art would have knowledge of and familiarity with the Standard, although the Standard is not incorporated herein, and this disclosure instead relies primarily on the present description of IP Codes.

An IP Code, as used herein, generally comprises the letters "IP" followed by two digits, e.g., "IP24." The first digit indicates a level of ingress protection with respect to solid foreign bodies. The second digit indicates a level of ingress protection with respect to moisture. The following numerals indicate the following specific levels of ingress protection with respect to solid foreign bodies:

0. No protection;
1. Protection from spherical objects having a diameter of at least 50 mm;
2. Protection from spherical objects having a diameter of at least 12.5 mm;
3. Protection from spherical objects having a diameter of at least 2.5 mm;
4. Protection from spherical objects having a diameter of at least 1.0 mm;
5. Protection from dust in quantities sufficient to interfere with satisfactory operation of the apparatus; and
6. Complete protection from the ingress of dust.

The following numerals indicate the following specific levels of ingress protection with respect to moisture:

0. No protection;
1. Vertically falling drops shall have no harmful effects;
2. Vertically falling drops shall have no harmful effects when the enclosure is titled at any angle up to 15° on either side of the vertical;
3. Water sprayed at an angle up to 60° on either side of the vertical shall have no harmful effects;
4. Water splashed against the enclosure from any direction shall have no harmful effects;
5. Water projected in jets at 12.5 l/min from a nozzle having a diameter of 6.3 mm against the enclosure from any direction shall have no harmful effects;

6. Water projected in powerful jets at 100 l/min against the enclosure from a nozzle having a diameter of 12.5 mm against the enclosure from any direction shall have no harmful effects;
7. Ingress of water in quantities causing harmful effects shall not be possible when the enclosure is immersed in water to a depth less than one meter for thirty minutes; and
8. Ingress of water in quantities causing harmful effects shall not be possible when the enclosure is continuously immersed in water to a depth greater than one meter.

When specifying a desired IP Code, either a zero ("0") or an "X" can be used in place of the first or the second digit to indicate indifference to the ingress protection of an enclosure to solid foreign bodies or moisture, respectively.

In different embodiments, the outer enclosure 104 and the inner enclosure 108 of the system 100 can have or conform to any desired combination of IP Codes. In some cases, the outer enclosure 104 and the inner enclosure 108 can have or conform to the same IP Code as each other, while in other cases, the outer enclosure 104 and the inner enclosure 108 can have or conform to different IP Codes. In system 100, the outer enclosure 104 can have or conform to IP Code IP3X or better ("better" meaning a higher degree of protection against contaminants), and the inner enclosure 108 can have or conform to IP Code IP5X or better. In some cases, the outer enclosure 104 can have or conform to IP Code IP3X or better and the inner enclosure 108 can have IP Code IP52 or better. In some cases, the outer enclosure 104 can have IP Code IP3X or better and the inner enclosure 108 can have IP Code IP54 or better.

In cases in which the outer enclosure 104 and inner enclosure 108 have or conform to different IP codes, the system 100 as a whole can be considered to have the better of the different IP Codes. The system 100 can have or conform to IP Code IP5X, IP52, IP54, or IP55. In some cases, the inner enclosure 108 can be sealed or hermetically sealed according to the plain and ordinary meaning of those terms, without reference to specific IP Codes. In some cases, the inner chamber 110 can be isolated from the external environment 102 according to the plain and ordinary meaning of the term "isolated," without reference to specific IP Codes.

Based on the foregoing discussion, an "enclosure," as that term is used herein, can have or conform to any of the IP Codes discussed herein, and is not necessarily sealed or hermetically sealed. An enclosure can include openings through which air can pass. An enclosure generally surrounds, protects, and houses components within an interior of the enclosure. Grammatical variations of "enclosure," such as "enclose" and "enclosing," as those terms are used herein, have equivalent meanings.

The outer enclosure 104 can include an inlet opening 112 at a first end 114 of the outer enclosure 104 and an outlet opening 116 at a second end 118 of the outer enclosure 104 opposite the first end 114. The heat exchange system 100 can include a first, outer fan 120 positioned at the inlet 112 so as to create an air current, when the fan 120 is running, that carries ambient air from the external environment 102 into the system 100 through the inlet 112, through the intermediate open space 106 which can function as a flow path 106 between the outer enclosure 104 and the inner enclosure 108, out of the system 100 through the outlet 116, and back into the external environment 102.

In following this flow path, the air encounters a first end 122 of the inner enclosure 108 where it splits to flow around the inner enclosure 108, forming a generally Y-shaped flow path. The air then flows along a first side wall 124 of the inner enclosure 108 and a second side wall 126 of the inner enclosure 108 opposite the first side wall 124. In alternative embodiments, the fan 120 can be positioned at the outlet 116 rather than at the inlet 112. In yet other embodiments, a fan can be provided at both the inlet 112 and at the outlet 116. In some embodiments, one or more fans can be provided within the flow path 106 of the air instead of or in addition to fans at the inlet 112 or the outlet 116.

FIG. 1 is a two-dimensional representation of the system 100. In some embodiments, a bottom of the inner enclosure 108 can be spaced apart from a bottom of the outer enclosure 104 such that the intermediate space or flow path 106 extends between the bottom of the inner enclosure 108 and the bottom of the outer enclosure 104. Similarly, in some embodiments, a top of the inner enclosure 108 can be spaced apart from a top of the outer enclosure 104 such that the intermediate space or flow path 106 extends between the top of the inner enclosure 108 and the top of the outer enclosure 104. In other embodiments, the bottom of the inner enclosure 108 and the bottom of the outer enclosure 104 can be directly coupled to or integral with one another, and the top of the inner enclosure 108 and the top of the outer enclosure 104 can be directly coupled to or integral with one another.

The inlet 112 includes guide elements 128 extending outwardly from an end wall 130 of the first end 114 of the outer enclosure 104. The second end 118 of the outer enclosure 104 does not include an end wall and the outlet 116 spans the entire width $W_1$ of the outer enclosure 104. In alternative embodiments, the second end 118 of the outer enclosure 104 includes an end wall, and the outlet 116 does not span the entire width $W_1$ of the outer enclosure 104. For example, the second end 118 of the outer enclosure 104 can include an end wall that spans the entire width $W_1$ of the outer enclosure and that has vents, or openings, or ports aligned with the flow path 106 to allow air flowing through the flow path 106 to exit the system 100 through the ports in the end wall at the second end 118 of the outer enclosure 104.

In other alternative embodiments, the second end 118 of the outer enclosure 104 includes a second end wall and guide elements extending outwardly therefrom, the first end 114 of the outer enclosure does not include the end wall 130, the inlet 112 does not include the guide elements 128, and the inlet 112 spans the entire width $W_1$ of the outer enclosure 104. Outer enclosure 104 and inner enclosure 108 both comprise overall rectangular cross-sectional shapes. In alternative embodiments, however, the outer enclosure 104 and the inner enclosure 108 can have any suitable cross-sectional shapes, and the outer enclosure 104 can have a cross-sectional shape the same as or different from a cross-sectional shape of the inner enclosure 108.

The system 100 also includes a second, inner fan 132 positioned within the inner enclosure 108. The inner fan 132 is positioned at a location closer to the first end 122 of the inner enclosure 108 than to a second end 134 of the inner enclosure 108. For example, the inner fan 132 can be positioned at a distance from the first end 122 that is less than ¼ of the distance between the first end 122 and the second end 134 of the inner enclosure 108. As another example, the inner fan 132 can be positioned at a distance from the first end 122 that is less than a width (i.e., a dimension in the direction of the width $W_1$) of the first end wall 136. As yet another example, the inner fan 132 can be positioned at a distance from the first end 122 that is selected or calculated, based on the capacity of the fan 132 and on the width of the first end wall 136, to optimize or improve the efficiency of the heat exchange system 100. The fan 132 has a width that is less than a width of the inner enclosure 108, such as less than half the width of the inner enclosure 108. The fan 132 can also be centered along the width of the inner enclosure 108 such that gaps exist between the fan 132 and each of the first side wall 124 and the second side wall 126 of the inner enclosure 108.

The fan 132 is positioned so as to create an air current within the inner enclosure 108 when the fan 132 is running. The air current carries air along a centerline of the inner enclosure 108 oriented perpendicularly to the width $W_1$ of the outer enclosure 104 toward the first end 122 of the inner enclosure 108. Upon approaching the first end 122 of the inner enclosure 108, the air can flow laterally outward from the centerline along the first end 122 toward the first and second side walls 124, 126 of the inner enclosure 108, and along the first and second side walls 124, 126 toward the second end 134 of the inner enclosure 108. The air can then flow laterally along the second end 134 toward the centerline, and then along the centerline, returning toward the fan 132. Thus, the air currents within the inner enclosure 108 can carry the air along the center of the inner enclosure 108 toward the first end 122 of the inner enclosure 108 and along the side walls 124, 126 of the inner enclosure 108 toward the second end 134 of the inner enclosure 108.

The first end 122 of the inner enclosure 108 can include a first end wall 136, with an internal heat sink 138 coupled to the first end wall 136 and positioned within the inner chamber 110 and an external heat sink 140 coupled to the first end wall 136 and positioned within the flow path 106. The internal heat sink 138, first end wall 136, and external heat sink 140 can conduct heat from the air within the inner chamber 110 to the flow path 106, where it can be carried out of the system 100 by the air flowing through the flow path 106. The combination of the internal heat sink 138, first end wall 136, and external heat sink 140 can be referred to as an air-to-air heat exchanger.

The heat exchange system 100 and the inner chamber 110 can house electrical components 142 such as electrical components of a laser marking system or of a barcode scanner. The electrical components 142 can include, for example, a power supply, pump diodes, electronic boards, processor(s), and/or any other electrical components discussed herein. When in use, the electrical components 142 can be heat sources or thermal loads from which it can be desirable to dissipate heat. Some of the components 142 (e.g., those indicated by reference numeral 142a) can be positioned against and thermally coupled to the first side wall 124. Some of the components 142 (e.g., those indicated by reference numeral 142b) can be positioned against and thermally coupled to the second side wall 126. Some of the components 142 (e.g., those indicated by reference numeral 142c) can be positioned within an interior of the inner chamber 110 and separated from the first and the second side walls 124, 126 such that heat cannot be conducted directly between the components 142 and the side walls 124, 126.

When the electrical components 142 are in use and generating heat, the heat exchange system 100 can be used to dissipate heat from the components 142 to prevent them from overheating and to ensure their effective operation. For example, the fan 120 can be turned on to cause air to flow through the flow path 106. The rotating speed of the fan 120 can be controlled as a function of the ambient air temperature to reduce the resulting noise as much as possible or to a desired level. Heat generated by the components 142 located against one of the first and second side walls 124, 126 can be conducted through the first or second side wall 124, 126 and can be carried away from the system 100 by convection by the air flowing through the flow path 106. The components 142 are generally small and hot relative to the first and second side walls 124, 126, and thus the first and second side walls 124, 126 can act as effective heat sinks to which heat from the components 142 can be efficiently transferred (e.g., by conduction in the case of the components 142 located against the first and second side walls 124, 126).

The fan 132 can be turned on to cause air to flow through the inner chamber 110 as described above. Heat generated by the components 142 separated from the first and second side walls 124, 126 can be carried by convection from the components 142 to the internal heat sink 138, can be carried by conduction from the internal heat sink 138 to the external heat sink 140, and can be carried away from the external heat sink 140 and the system 100 by convection by the air flowing through the flow path 106. The first and second side walls 124, 126, the first end wall 136, and the internal and external heat sinks 138, 140 can be fabricated from highly heat-conductive materials, so as to increase the dissipation of heat away from the electrical components 142 as described above. As specific examples, these components can be fabricated from metals such as aluminum or copper, as well as thermally conductive plastics or ceramics.

It has been found to be particularly advantageous to position the fan 132 nearer to the first end 122 than to the second end 134 of the inner enclosure 108, and to position the heat sinks 138, 140 at the first end 122 of the inner enclosure 108. Positioning the fan 132 near to the first end 122 of the inner enclosure 108 improves heat transfer between the air in the inner chamber 110 and the internal heat sink 138. Further, positioning the heat sinks 138, 140 at the first end 122 of the inner enclosure 108, which is positioned near to the first end 114 of the outer enclosure 104, improves dissipation of heat from the heat sink 140 to the air flowing through the flow path 106 because the air flowing into the inlet 112 is the coolest air in the flow path 106. That is, it has not yet been heated up by passing over the first and second side walls 124, 126.

As noted above, the heat exchange system 100 and the inner chamber 110 can house the electrical components of a laser marking system or of a barcode scanner. A laser marking system can include a laser and a controller coupled to the laser. The laser acts similar to a pencil in that the beam emitted from it allows the controller to trace a pattern onto a surface on which a marking is to be made. The controller, which may be a processor-based device, controls the direction, intensity, speed of movement, spread, and other parameters of the laser beam. A laser marking system may work in either a raster mode or a vector mode. Raster marking traces the laser across the surface in a back-and-forth linear pattern. Vector marking instead follows the line(s) and curve(s) of the pattern to be marked.

Barcode scanners, machine-readable symbol readers, and data readers are used to capture images or representations of machine-readable symbols appearing on various surfaces to read information encoded in the machine-readable symbol. One commonly used machine-readable symbol reader is an imager- or imaging-based machine-readable symbol reader. Imaging-based machine-readable symbol readers typically employ flood illumination to simultaneously illuminate the entire machine-readable symbol, either from dedicated light sources, or in some instances using ambient light. Such is in contrast to scanning or laser-based (i.e., flying spot) type machine-readable symbol readers, which scan a relatively narrow beam or spot of light sequentially across the machine-readable symbol.

Imaging-based machine-readable symbol readers typically include solid-state image circuitry, such as charge-coupled devices (CCDs) or complementary metal-oxide semiconductor (CMOS) devices, and may be implemented using a one-dimensional or two-dimensional imaging array of photosensors (or pixels) to capture an image of the machine-readable symbol. One-dimensional CCD or CMOS readers capture a linear cross-section of the machine-readable symbol, producing an analog waveform whose amplitude represents the relative darkness and lightness of the machine-readable symbol. Two-dimensional CCD or CMOS readers may capture an entire two-dimensional image which can be processed to find and decode a machine-readable symbol.

Machine-readable symbol readers include manual readers, semi-automatic readers, and automated readers. With manual or semi-automatic readers (e.g., a hand-held type reader, or a fixed-position reader), a human operator positions an object relative to the view volume of the reader to read the machine-readable symbol associated with the object. In an automated reader (e.g., a portal or tunnel scanner), a conveyor automatically positions the object relative to the view volume, and transports the object through the view volume so that the reader can automatically read the machine-readable symbol associated with the object. The components of the various devices described herein can be housed within the heat exchange system 100 and the inner chamber 110.

In addition to the laser marking systems and machine readable symbol readers described above, the heat exchange system 100 and the inner chamber 110 can house the electrical or mechanical components of various other devices, such as RFID readers, any one-dimensional or two-dimensional imaging-based cameras for reading barcodes, two-dimensional codes, two-dimensional characters (such as for OCR), or for object inspection. The heat exchange system 100 can be particularly useful in transportation or logistics applications, in which high-power illumination or processors can be used. The heat exchange system 100 and the inner chamber 110 can also house the electrical or mechanical components of various dimensioning systems, such as for measuring the height, width, length, volume, or other dimensions of various cuboidal or irregularly-shaped objects based on imaging or laser scanning technologies.

Figure 2:
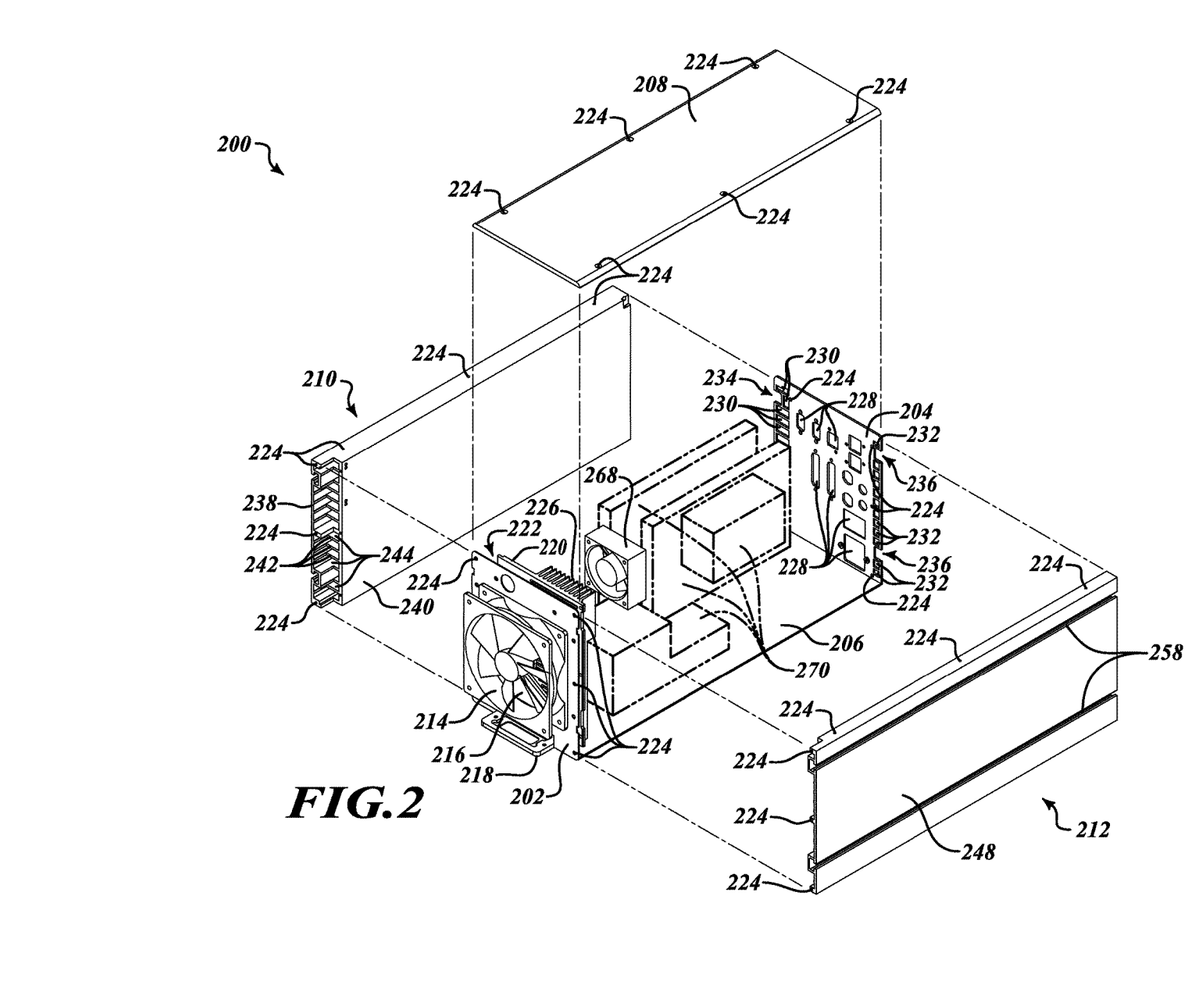
FIG. 2 is an exploded perspective view of a laser marking system including a heat exchange system, according to at least one illustrated embodiment.

FIGS. 2-7 illustrate a laser marking system 200 including a heat exchange system similar to that of system 100. As shown in FIG. 2, the laser marking system 200 includes an external front wall 202, a rear wall 204, a bottom wall 206, a top wall 208, a left side wall component 210, and a right side wall component 212. The front wall 202, rear wall 204, bottom wall 206, top wall 208, left side wall component 210, and right side wall component 212 can be coupled to one another and assembled to form the system 200, and can be disassembled from one other, such as for cleaning the system, replacement of parts enclosed within the system, etc. For example, the front wall 202, rear wall 204, bottom wall 206, top wall 208, left side wall component 210, and right side wall component 212 can include a plurality of screw holes 224 to allow these components to be removably coupled to one another with screws (not shown).

The front wall 202 can include an opening 216 at the center of the front wall 202, and the system 200 can include an external fan 214 coupled to an exterior surface of the front wall 202 such that the fan 214 can cause air to flow into or out of the opening 216 in the front wall 202. The system 200 can also include a coupling element 218 including a rigid loop of material projecting outwardly from the front, exterior surface of the front wall 202. The coupling element 218 can be used to couple other components to the system 200, or can be used to couple the system 200 to supporting elements such as a rack or a frame for supporting or carrying the system 200.

Figure 4:
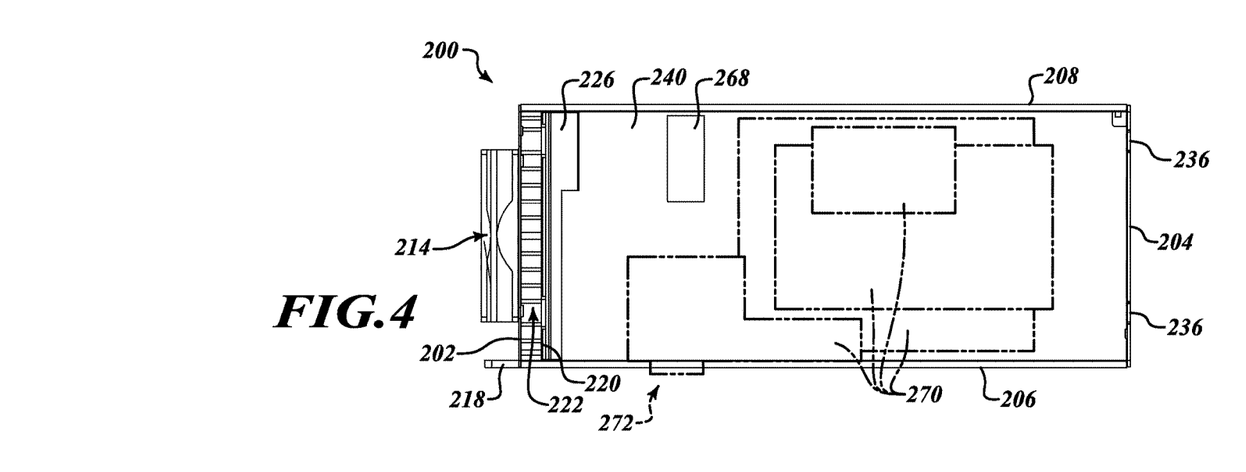
FIG. 4 is another side view of the laser marking system of FIGS. 2-3, according to at least one illustrated embodiment.
Figure 6:
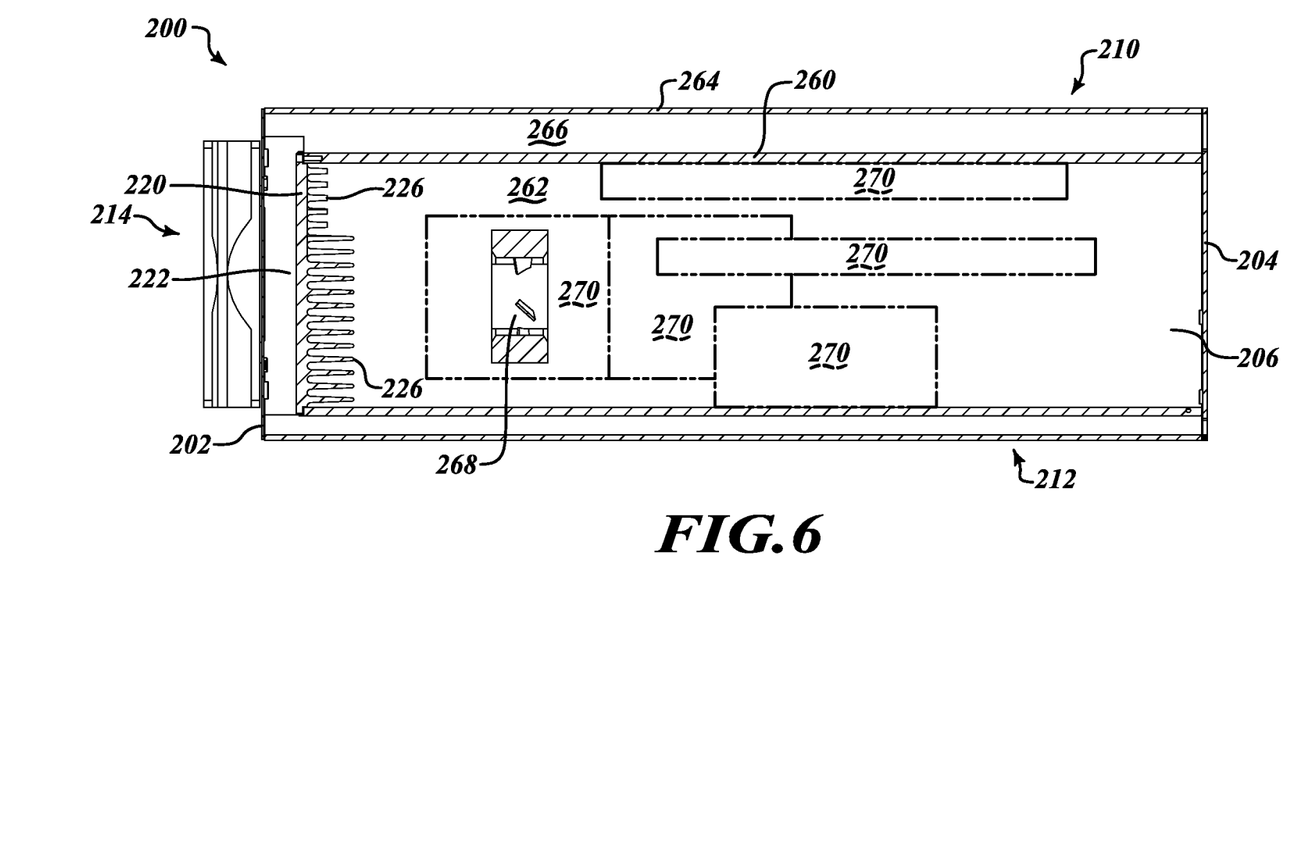
FIG. 6 is a cross-sectional top view of the laser marking system of FIGS. 2-5, according to at least one illustrated embodiment.

The system 200 also includes an internal front wall 220 positioned near to but spaced apart from the external front wall 202 such that the internal front wall 220 and the external front wall 202 are parallel to one another and separated from one another by a front open space 222, as also shown in FIGS. 4 and 6. The system 200 also includes a heat sink 226 coupled to an interior surface of the internal front wall 220 such that the heat sink 226 extends away from the internal front wall 220 toward the rear wall 204.

The rear wall 204 includes a plurality of openings 228 to accommodate various electrical connectors or ports, such as USB, PS/2, TCP/IP Ethernet, RJ 45, RS 232, VGA, HDMI, TTL I/O, 4-axis control, photocell and encoder, laser interlock, power, and other known connectors or ports. A left side portion of the rear wall 204 includes a plurality of left vent ports 230 and a plurality of indentations 234 (one is shown in FIG. 2). A right side portion of the rear wall 204 includes a plurality of right vent ports 232 and a plurality of indentations 236. The vent ports 230 and indentations 234 can be positioned on the rear wall 204 to align with the left side wall component 210, and the vent ports 232 and indentations 236 can be positioned on the rear wall 204 to align with the right side wall component 212, when the system 200 is assembled.

The external front wall 202, internal front wall 220, and the rear wall 204 can be coupled to the bottom wall 206 and extend upwardly from the bottom wall 206 in a direction generally perpendicular to the bottom wall 206. As examples, the external front wall 202, internal front wall 220, and the rear wall 204 can be coupled to the bottom wall 206 by mechanical fasteners such as screws, by adhesives, by welding, or by being formed integrally with the bottom wall 206.

The left side wall component 210 can include an external left side wall 238, an internal left side wall 240, and a plurality of web elements 242 spanning between the external left side wall 238 and the internal left side wall 240 to couple the external and internal left side walls 238, 240 to one another and to form a plurality of flow channels 244 extending along the length of the left side wall component 210. The external left side wall 238 includes a plurality of grooves 276 positioned along the length of the left side wall component 210 (see FIG. 7). The external left side wall 238 can have a longer length that the internal left side wall 240, such that the external left side wall 238 extends farther toward the front wall 202 of the system 200 than the internal left side wall 240.

The right side wall component 212 can include an external right side wall 248, an internal right side wall 250 (see FIGS. 5-6), and a plurality of web elements 252 (see FIG. 5) spanning between the external right side wall 248 and the internal right side wall 250 to couple the external and internal right side walls 248, 250 to one another and to form a plurality of flow channels 254 (see FIG. 5) extending along the length of the right side wall component 212. The external right side wall 248 includes a plurality of grooves 258 positioned along the length of the right side wall component 212. The external right side wall 248 can have a longer length that the internal right side wall 250, such that the external right side wall 248 extends farther toward the front wall 202 of the system 200 than the internal right side wall 250.

The left side wall component 210 and the right side wall component 212 can be coupled to the bottom wall 206, external front wall 202, internal front wall 220, and rear wall 204 such that they are perpendicular to each of the bottom wall 206, external front wall 202, internal front wall 220, and rear wall 204 and substantially parallel to one another. When the system 200 is assembled, the external left side wall 238 and the external right side wall 248 are each coupled to and span from the external front wall 202 to the rear wall 204. When the system 200 is assembled, the internal left side wall 240 and the internal right side wall 250 are each coupled to and span from the internal front wall 220 to the rear wall 204. When the system 200 is assembled, the flow channels 244 fluidically couple the front open space 222 to the left vent ports 230 and the flow channels 254 fluidically couple the front open space 222 to the right vent ports 232.

When the system 200 is assembled, the grooves 276 are aligned with the indentations 234 and the grooves 258 are aligned with the indentations 236. The grooves 276 and 258 each include a relatively narrow opening 278 in communication with a relatively wide internal space 280 (see FIG. 5). A generally T-shaped element (not illustrated) can enter the grooves 276, 258 at the indentations 234, 236, respectively, and slide along the grooves 276, 258 until they reach a desired location. Thus, the grooves 276, 258 can function as rails from which supporting elements can support the system 200.

The top wall 208 can be coupled to the left side wall component 210, the right side wall component 212, the external front wall 202, the internal front wall 220, and the rear wall 204 such that it is perpendicular to each of the left side wall component 210, the right side wall component 212, the external front wall 202, the internal front wall 220, and the rear wall 204 and substantially parallel to the bottom wall 206. When the system 200 is assembled, the top wall 208, the bottom wall 206, the internal front wall 220, the internal left side wall 240, the internal right side wall 250, and the rear wall 204 can form an inner enclosure 260 (see FIG. 6) similar to the inner enclosure 108, which bounds or defines an inner chamber 262 (see FIG. 6) similar to inner chamber 110.

When the system 200 is assembled, the top wall 208, the bottom wall 206, the external front wall 202, the external left side wall 238, the external right side wall 248, and the rear wall 204 can form an outer enclosure 264 (see FIG. 6) similar to the outer enclosure 104 such that an intermediate space or flow path 266 (see FIG. 6) is bounded or defined between the outer enclosure 264 and the inner enclosure 260. The flow path 266 includes the opening 216 in the front wall 202, the front open space 222, the flow channels 244 and 254, and the vent ports 230 and 232. The flow path 266 is similar to the flow path 106.

Figure 3:
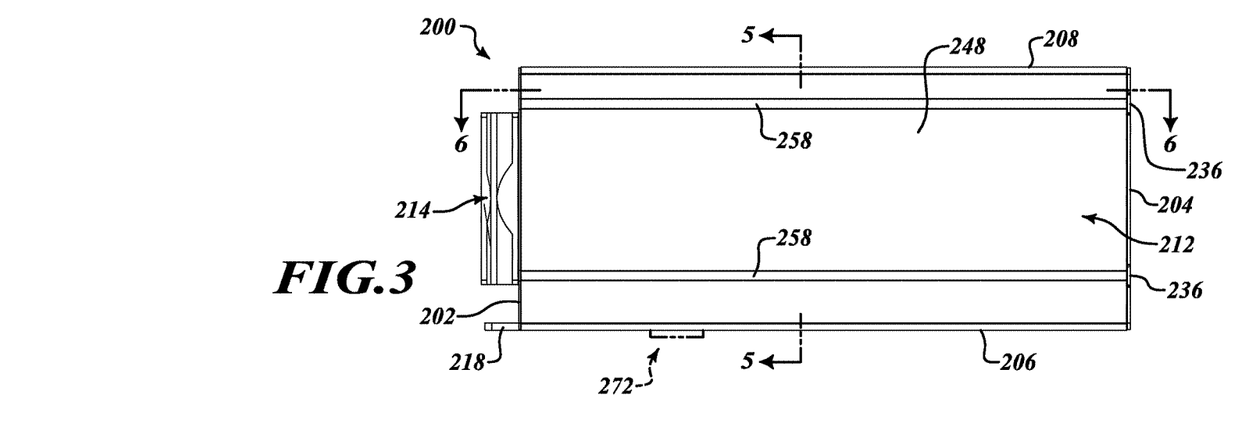
FIG. 3 is a side view of the laser marking system of FIG. 2, according to at least one illustrated embodiment.
Figure 5:
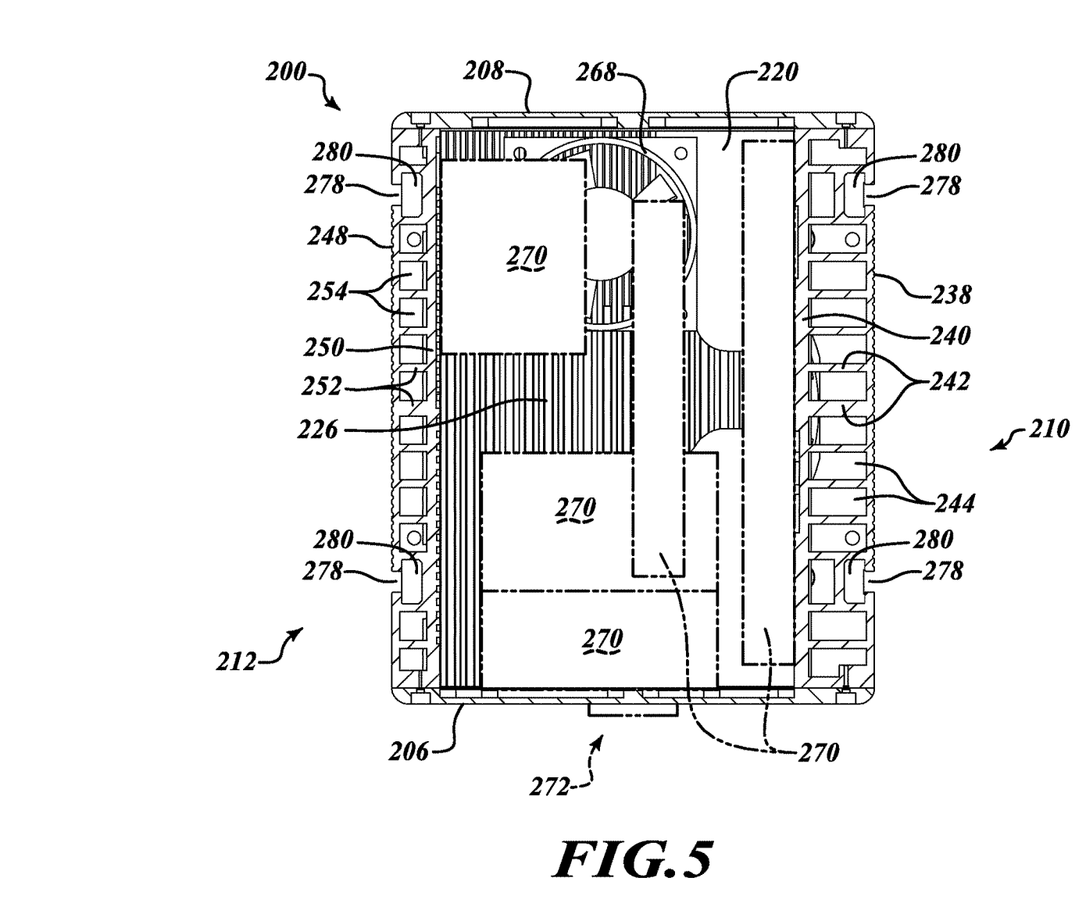
FIG. 5 is a cross-sectional rear end view of the laser marking system of FIGS. 2-4, according to at least one illustrated embodiment.

FIG. 3 is a side view of the assembled laser marking system 200, looking from right to left. FIG. 4 is another side view of the laser marking system 200, looking from right to left, with the right side wall component 212 removed from the system 200. FIG. 5 is a cross-sectional rear end view of the laser marking system 200, taken along line 5-5 in FIG. 3. FIG. 6 is a cross-sectional top view of the laser marking system 200, taken along line 6-6 in FIG. 3.

As shown in FIGS. 2 and 4-6, the inner enclosure 260 houses an internal fan 268 and a plurality of heat-generating components 270 of the laser marking system 200. The fan 268 is positioned nearer to the internal front wall 220 than to the rear wall 204 of the system 200. In some cases, the fan 268 can be positioned at a distance from the internal front wall 220 that is less than a width (i.e., a dimension in the direction from the left side wall component 210 to the right side wall component 212) of the internal front wall 220. The fan 268 is positioned near to or adjacent to the top wall 208 of the system 200 and the fan 268 is spaced apart from the top wall 208 of the system 200. In alternative embodiments, the fan 268 can be positioned at any elevation between the bottom wall 206 and the top wall 208. In some cases, the position of the fan 268 within the inner enclosure 260 can be based on the location(s) of the electrical components 270 within the inner enclosure, either to ensure adequate clearance between the fan 268 and the components 270, and/or to improve the heat-dissipating efficiency of the system 200.

The fan 268 is positioned so as to create an air current within the inner enclosure 260 when the fan 268 is running. The air current can follow paths similar to those described above with regard to fan 132 and inner enclosure 108. In addition, upon approaching the internal front wall 220, the air can flow in a direction aligned with the fins of the heat sink 226, that is, toward the bottom wall 206 or the top wall 208. In some cases, the fins of the heat sink 226 can form grooves through which these air currents can flow. The air can then flow along the bottom wall 206 from the internal front wall 220 toward the rear wall 204, and then toward the top wall 208 along the rear wall 204, or along the top wall 208 from the internal front wall 220 toward the rear wall 204, and then toward the bottom wall 206 along the rear wall 204. Thus, the air currents within the inner enclosure 260 can be similar to those shown in FIG. 1 on the same plane as shown in FIG. 1 as well as on a plane orthogonal to that shown in FIG. 1.

A first one of the electrical components 270 is positioned in contact with the internal left side wall 240. A second one of the electrical components 270 is positioned in contact with the internal right side wall 250. A third one of the electrical components 270 is positioned in contact with the bottom wall 206, but spaced apart from and not in contact with either of the internal left or right side walls 240, 250. A fourth one of the electrical components 270 is spaced apart from and not in contact with any of the bottom wall 206 or the internal left or right side walls 240, 250 (e.g., it can be mounted to one of the walls via intermediate elements not shown in the Figures). None of the electrical components 270 are positioned in contact with the internal front wall 220, rear wall 204, or the top wall 208. In alternative embodiments, electrical components can be positioned in contact within any combination of the internal front wall 220, the rear wall 204, the internal left and right side walls 240, 250, the bottom wall 206, and the top wall 208.

The web elements 242 of the left side wall component 210 can be longer than the web elements 252 of the right side wall component 212 such that the external left side wall 238 is farther from the internal left side wall 240 than the external right side wall 248 is from the internal right side wall 250. In such embodiments, a greater portion of the air flowing through the flow channels 244 and 254 flows through the flow channels 244 than through the flow channels 254. This can be particularly advantageous, for example, if a greater amount of heat energy is desired to be dissipated through the internal left side wall 240 than through the internal right side wall 250. In some cases, analytical or experimental tests can be conducted to determine the amount of heat energy desired to be dissipated through each of the internal side walls 240, 250, such as based on the number and location of the electrical components 270, and the relative sizes of the web elements 242, 252, can be selected to accommodate the results.

The system 200 also includes a lens or other optical element 272 through which a laser beam generated by the laser marking system 200 exits the system 200. The optical element 272 couples the laser beam out of the system 200 through the bottom wall 206 of the system 200. Thus, electrical and optical elements associated with the coupling of the laser beam out of the system 200 are positioned adjacent to and in contact with the bottom wall 206 of the system 200 and the fan 268 is positioned nearer the top wall 208 than the bottom wall 206 to accommodate such electrical and optical elements.

Figure 7:
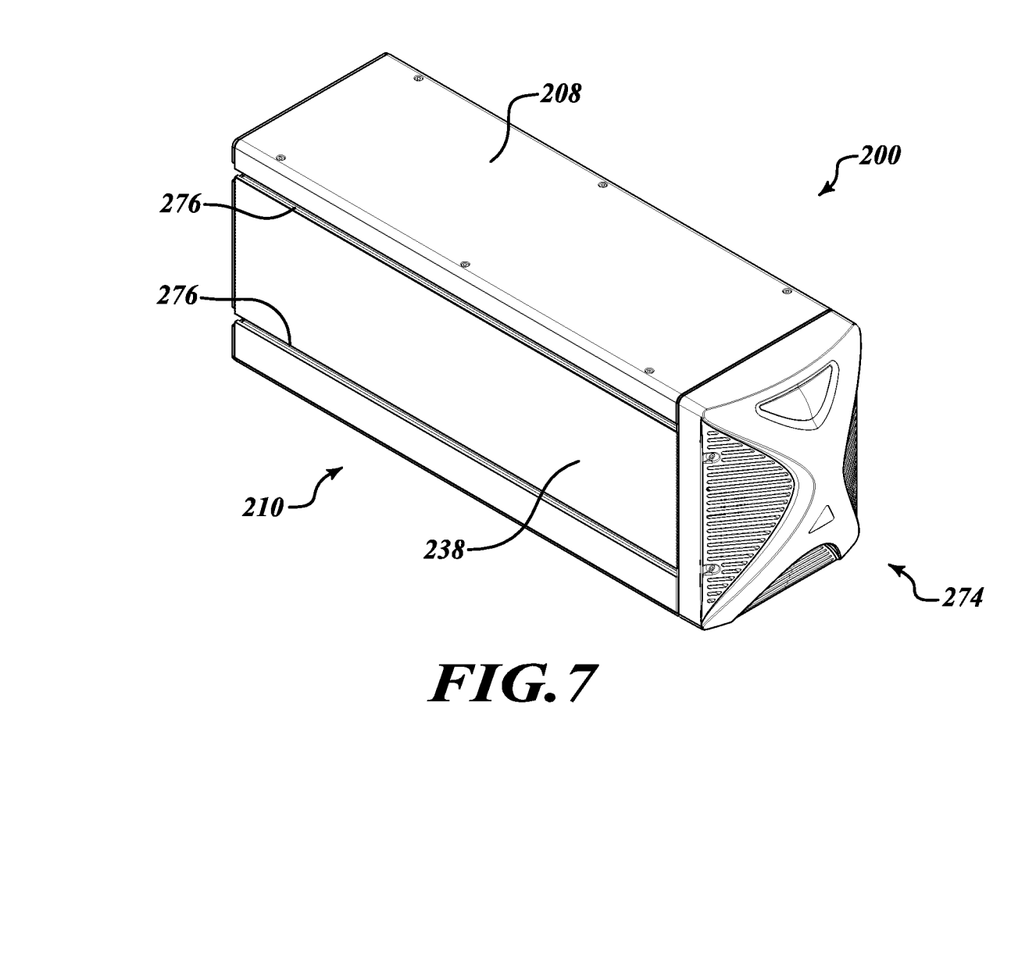
FIG. 7 is a front perspective view of the laser marking system of FIGS. 2-6, according to at least one illustrated embodiment.

FIG. 7 is a front perspective view of the laser marking system 200 fully assembled. As shown in FIG. 7, the laser marking system 200 can include a front cover 274 to cover the fan 214 and provide additional protection against contaminants. The front cover 274 can be coupled to the coupling element 218 or to the fan 214. FIG. 7 also shows that the fully assembled system 200 includes the indentations 234 aligned with the grooves 276 extending along the length of the left side wall component 210. Together the indentations 234 and grooves 276 can form a fixing element which can allow the system 200 to be fixed to a rack or frame to be supported thereon while in use. Similarly, together, the indentations 236 and grooves 258 can form another fixing element. In other embodiments, the bottom wall 206 and the top wall 208 can also have fixing elements incorporated therein. In some cases, the coupling element 218 can be used as a fixing element. The system 200 can be mounted in any desired orientation, for example, such that the bottom wall 206 lies in either a horizontal or a vertical plane.

The system 200 has an operating temperature range of at least 5-40° C. In some cases, the system 200 has an overall length between a front end portion of the front cover 274 and an exterior surface of the rear wall 204 of less than 500 mm, an overall width between an exterior surface of the left side wall component 210 and an exterior surface of the right side wall component 212 of less than 150 mm, and an overall height from a bottom end portion of the optical element 272 and an exterior surface of the top wall 208 of less than 180 mm. In some cases, the system 200 has an overall length of about 479 mm, an overall width of about 150 mm, and an overall height of about 183 mm. The laser marking system 200 can include a 100, 220, or 240, 50/60 Hz VAC power supply. The system 200 has or conforms to an IP Code of IP52 or better. In some cases, the system 200 has or conforms to an IP Code of IP54.

The system 200 achieves a desired level of compactness, cost, IP rating, and heat dissipation without the use of air filters or liquid coolants. In alternative embodiments, however, the system 200 can include air filters, liquid coolants, and/or heat pipes to increase the energy dissipating ability of the system 200. As one example, heat pipes can be used to help transfer heat from the components 270 to the internal left or right side walls 240, 250. The system 200 provides a laser marking system that can be used in harsher environments and that has a longer expected lifetime than other known laser marking systems.

In alternative embodiments, various subsets and combinations of the features described herein can be used. In one alternative embodiment, a heat exchange system is similar to heat exchange system 100 but does not include electrical components positioned against the side walls 124, 126, and does not include an outer enclosure. In another alternative embodiment, a heat exchange system is similar to heat exchange system 100 but does not include electrical components positioned against the side walls 124, 126, and does not include an outer enclosure or an outer fan.

In other alternative embodiments, the bottom wall 206 comprises a bottom wall component similar to the left and right side wall components 210, 212, wherein an internal bottom wall is coupled to and spans from the internal front wall 220 to the rear wall 204 and an external bottom wall is coupled to and spans from the external front wall 202 to the rear wall 204. Similarly, in other alternative embodiments, the top wall 208 comprises a top wall component similar to the left and right side wall components 210, 212, wherein an internal top wall is coupled to and spans from the internal front wall 220 to the rear wall 204 and an external top wall is coupled to and spans from the external front wall 202 to the rear wall 204. In such embodiments, the rear wall 204 can include additional vent ports aligned with the bottom or the top wall components. In such embodiments, the flow path 266 can extend below or over the inner chamber 262 in addition to along the sides of the inner chamber 262.

In some embodiments, general locations of the electrical components 270 within the inner chamber 262 can be determined. Based on the general locations of the electrical components 270, one or more of the left side, right side, top, and bottom of the inner chamber 262 can be designated as walls against which the electrical components 270 are to be positioned. Specific locations of the electrical components 270 can then be assigned so that the electrical components 270 are positioned against those walls. The system 200 can be configured such that the flow path 266 extends along those walls, so as to allow the efficient dissipation of heat from the electrical components 270 positioned against those walls.

In some embodiments, the fans 214, 268 can be replaced or supplemented with other devices that can induce the desired air currents in the system 200. For example, synthetic jets comprising a piezoelectric-driven membrane or diaphragm can be used within the inner chamber 262 to induce desired air currents therein. As another example, compressed air can be expelled into the flow path 266 to induce desired air currents therein.

In some embodiments, a plurality of the laser marking systems 200 can be positioned side by side or adjacent to one another. For example, a first laser marking system 200 can be positioned such that an exterior surface of its external right side wall 248 is in contact with an exterior surface of the external left side wall 238 of a second laser marking system 200. The second laser marking system 200 can be positioned such that an exterior surface of its external right side wall 248 is in contact with an exterior surface of the external left side wall 238 of a third laser marking system. Any suitable number of laser marking systems can be positioned in this manner. Such an arrangement is facilitated by the enclosure of all components of the system 200 between the external left side wall 238 and the external right side wall 248.

The systems described herein can be used to remove or dissipate heat from any hot or heat-generating object, or to provide heat to or concentrate heat within any cold or heat-consuming object. In specific implementations, the systems described herein can be used to dissipate heat from any electrical, electronic, or mechanical source of heat.

A method of fabricating a heat exchange system can include enclosing an inner fan and a heat source such as an electrical component within an inner enclosure. The method can further include enclosing the inner enclosure within an outer enclosure such that a flow path is defined between the inner enclosure and the outer enclosure. The method can further include positioning an outer fan to be able to induce air flow through the flow path. Additional, alternative, and more specific methods of fabricating heat exchange systems can include fabricating and assembling the components of the systems as described above.

A method of using a heat exchange system can include generating heat at a heat source within an inner enclosure. The method can further include using an inner fan within the inner enclosure to dissipate the heat from the heat source to one or more walls of the inner enclosure by convection. The method can further include using an outer fan outside the inner enclosure to induce air to flow through a flow path between the inner enclosure and an outer enclosure enclosing the inner enclosure to dissipate heat from the walls of the inner enclosure by convection. Additional, alternative, and more specific methods of using heat exchange systems can include using the components of the systems as described above.

Those of skill in the art will recognize that many of the methods or algorithms set out herein may employ additional acts, may omit some acts, and/or may execute acts in a different order than specified. The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A heat exchange system comprising:
   an outer enclosure;
   an inner enclosure enclosed within the outer enclosure, the inner enclosure having a length extending from a first end of the inner enclosure to a second end of the inner enclosure opposite the first end, the inner enclosure having a width extending from a first side wall of the inner enclosure to a second side wall of the inner enclosure opposite the first side wall, the inner enclosure having a centerline centered along the width of the inner enclosure and extending along the length of the inner enclosure;
   a first heat sink that extends into the inner enclosure from an interior surface of a wall that defines the first end of the inner enclosure;
   a second heat sink that extends into the outer enclosure from an exterior surface of the wall that defines the first end of the inner enclosure;
   a flow path defined between the outer enclosure and the inner enclosure;
   an outer fan positioned to induce air flow through the flow path, such that a portion of the flow path extends along a first direction toward the second heat sink;
   an inner fan enclosed within the inner enclosure, the inner fan positioned on the centerline such that the inner fan, when running, creates an air current extending along the centerline in a second direction, which is opposite the first direction, toward the first heat sink and laterally outward from the centerline along the first end of the inner enclosure toward the first and second side walls of the inner enclosure; and
   a heat source enclosed within the inner enclosure.

2. The system of claim 1 wherein the heat source is an electrical component of a laser marking system.

3. The system of claim 2 wherein the laser marking system is enclosed within the inner enclosure.

4. The system of claim 1 wherein the heat source is an electrical component of a machine readable symbol reader.

5. The system of claim 1 wherein the inner enclosure is hermetically sealed.

6. The system of claim 1 wherein the heat source is positioned within an inner chamber within the inner enclosure and the inner chamber is isolated from an external environment of the system.

7. The system of claim 1 wherein the inner enclosure conforms to IP Code IP52 or better.

8. The system of claim 1 wherein:
   the outer enclosure includes a first front wall, a rear wall opposed to the first front wall, a bottom wall, a top wall opposed to the bottom wall, a first outer side wall, and a second outer side wall opposed to the first outer side wall;
   the wall that defines the first end of the inner enclosure is spaced apart from the first front wall, the rear wall, the bottom wall, and the top wall;
   the first side wall is spaced apart from the first outer side wall; and
   the second side wall is spaced apart from the second outer side wall.

9. A heat exchange system comprising:
   an outer enclosure;
   an inner enclosure enclosed within the outer enclosure, the inner enclosure having a length extending from a first end of the inner enclosure to a second end of the inner enclosure opposite the first end, the inner enclosure including a plurality of walls that define an outer boundary of the inner enclosure, the plurality of walls including a first side wall and a second side wall opposite the first side wall, the inner enclosure having a width extending from the first side wall to the second side wall, the inner enclosure having a centerline centered along the width of the inner enclosure and extending along the length of the inner enclosure;
   a first heat sink that extends into the inner enclosure from an interior surface of one of the plurality of walls that defines the first end of the inner enclosure;
   a second heat sink that extends into the outer enclosure from an exterior surface of the one of the plurality of walls that defines the first end of the inner enclosure;
   a flow path defined between the outer enclosure and the inner enclosure;
   an outer fan positioned to induce air flow through the flow path, such that a portion of the flow path extends along a first direction toward the second heat sink;
   an inner fan enclosed within the inner enclosure, the inner fan positioned on the centerline such that the inner fan, when running, creates an air current extending along the centerline in a second direction, which is opposite the first direction, toward the first heat sink and laterally outward from the centerline along the first end of the inner enclosure toward the first and second side walls of the inner enclosure; and
   a heat source enclosed within the inner enclosure such that the heat source is separated from each of the plurality of walls.

10. The system of claim 9 wherein the heat source is a first heat source and the system further comprises a second heat source in contact with at least one of the walls.

11. The system of claim 10 wherein the system includes a convective heat path from the first heat source to the plurality of walls, a conductive heat path from the second heat source to the plurality of walls, a conductive heat path through the plurality of walls, and a convective heat path from the plurality of walls out of the system through the flow path.

12. The system of claim 9 wherein:
the outer enclosure includes a first front wall, a rear wall opposed to the first front wall, a bottom wall, a top wall opposed to the bottom wall, a first outer side wall, and a second outer side wall opposed to the first side wall; and
the plurality of walls includes:
the one of the plurality of walls that defines the first end of the inner enclosure spaced apart from the first front wall, the rear wall, the bottom wall, and the top wall;
the first side wall spaced apart from the first outer side wall; and
the second side wall spaced apart from the second outer side wall and opposed to the third side wall.

13. A heat exchange system comprising:
an outer enclosure;
an inner enclosure enclosed within the outer enclosure, the inner enclosure having a length extending from a first end wall of the inner enclosure to a second end wall of the inner enclosure opposite the first end wall, the inner enclosure having a width extending from a first side wall of the inner enclosure to a second side wall of the inner enclosure opposite the first side wall;
a first heat sink that extends into the inner enclosure from an interior surface of the first end wall;
a second heat sink that extends into the outer enclosure from an exterior surface of the first end wall;
a flow path defined between the outer enclosure and the inner enclosure;
an outer fan positioned to induce air flow in a first direction, toward the second heat sink, and through the flow path;
an inner fan enclosed within the inner enclosure such that the inner fan, when running, creates an air current in a second direction opposite the first direction, toward the first heat sink; and
a heat source enclosed within the inner enclosure.

14. The system of claim 13 wherein the inner enclosure has a centerline centered along the width of the inner enclosure and extending along the length of the inner enclosure, and the inner fan is positioned on the centerline.

15. The system of claim 14, wherein the air current created by the inner fan, after intersecting the first end wall, spreads laterally outward from the centerline toward the first side wall and the second side wall.

16. The system of claim 13 wherein:
the outer enclosure includes a front wall, a rear wall opposed to the front wall, a bottom wall, a top wall opposed to the bottom wall, a first outer side wall, and a second outer side wall opposed to the first outer side wall; and
the first end wall is spaced apart from the front wall, the rear wall, the bottom wall, and the top wall.

* * * * *